United States Patent
Kim (10) Patent No.: US 9,941,659 B2
(45) Date of Patent: Apr. 10, 2018

(54) OPTICAL MODULE FOR ULTRAHIGH-SPEED COMMUNICATION

(71) Applicant: PHOVEL.CO.LTD., Yuseong-gu, Daejeon (KR)

(72) Inventor: Jeong-Soo Kim, Gongju-si (KR)

(73) Assignee: PHOVELCO.LTD., Yuseong-Gu, Daejeon (KR)

( * ) Notice: Subject to any disclaimer, the term of this patent is extended or adjusted under 35 U.S.C. 154(b) by 0 days.

(21) Appl. No.: 14/907,078

(22) PCT Filed: Jul. 24, 2014

(86) PCT No.: PCT/KR2014/006725
§ 371 (c)(1),
(2) Date: Jan. 22, 2016

(87) PCT Pub. No.: WO2015/012603
PCT Pub. Date: Jan. 29, 2015

(65) Prior Publication Data
US 2016/0156151 A1   Jun. 2, 2016

(30) Foreign Application Priority Data
Jul. 24, 2013  (KR) ........................ 10-2013-0087682

(51) Int. Cl.
*H01S 3/00* (2006.01)
*H01S 5/042* (2006.01)
(Continued)

(52) U.S. Cl.
CPC .......... *H01S 5/042* (2013.01); *H01S 5/02256* (2013.01); *H01S 5/02276* (2013.01);
(Continued)

(58) Field of Classification Search
CPC .. H01S 5/042; H01S 5/02276; H01S 5/02256; H01S 5/06226; H01S 5/02212; H01S 5/02292
See application file for complete search history.

(56) References Cited

U.S. PATENT DOCUMENTS

| 2005/0084201 A1* | 4/2005 | Akashi | ................ G02B 6/4201 385/14 |
| 2012/0183009 A1* | 7/2012 | Adachi | ................ G02B 6/4214 372/99 |

(Continued)

FOREIGN PATENT DOCUMENTS

| JP | 2004-342882 A | 12/2004 |
| JP | 2012-119585 | 6/2012 |

(Continued)

OTHER PUBLICATIONS

KR10-0138846 English Translation.*
International Search Report issued in corresponding PCT application PCT/KR014/006725 dated Oct. 24, 2014.

*Primary Examiner* — Yuanda Zhang
(74) *Attorney, Agent, or Firm* — Davis & Bujold PLLC; Michael J. Bujold (57) ABSTRACT

A TO can-type optical module for ultrahigh-speed communication including a laser diode chip for at least 5 Gbps. A substrate for transmitting a signal to a laser diode chip is formed by coupling an upper substrate (210) on which line patterns for transmission are formed, to a lower substrate (220) of which an upper surface has conductivity with the upper substrate (210) such that the optical module for ultrahigh-speed communication has single ended impedance of 25 ohms or differential ended impedance of 50 ohms. The substrate has a height of about 0.4 mm to which a laser diode chip, for ultrahigh-speed communication, is attached to enable an optical coupling between the laser diode chip, the (Continued)

lens, and the like, and may implement a hight-speed transmission line using a width of 0.6 mm or less thereby providing a substrate which is effectively embedded ina TO can-type package with a narrow mounting area.

5 Claims, 6 Drawing Sheets

(51) Int. Cl.
    *H01S 5/022*     (2006.01)
    *H01S 5/062*     (2006.01)

(52) U.S. Cl.
    CPC ....... *H01S 5/02212* (2013.01); *H01S 5/02292* (2013.01); *H01S 5/06226* (2013.01)

(56) References Cited

U.S. PATENT DOCUMENTS

2012/0281725 A1     11/2012   Huff et al.
2013/0248819 A1     9/2013   Aihara

FOREIGN PATENT DOCUMENTS

KR     10-0138846 B1     6/1998
KR     2011-0066321 A     6/2011

* cited by examiner

OPTICAL MODULE FOR ULTRAHIGH-SPEED COMMUNICATION

TECHNICAL FIELD

The present invention relates to an optical module for ultrahigh-speed communication, and more particularly, to a TO can-type optical module for ultrahigh-speed communication including a laser diode chip for ultrahigh-speed communication of 5 Gbps (Giga bit per sec) or more.

BACKGROUND ART

Recently, optical communication using light as a medium for information transmission to transmit large-size information and high-speed information communication has been popularized. Recently, it is possible to easily convert an electrical signal of 5 Gbps into laser light, using a semiconductor laser diode chip having width and length of about 0.3 mm, and to easily convert an optical signal transmitted through an optical fiber into an electrical signal, using a semiconductor light receiving element. Light is an energy wave having very special characteristics, and in order for several lights that simultaneously exist in any one region to interact with each other, lights to be interacted with each other need to have the same wavelength, or phases of lights need to be matched to each other, and propagation directions thereof need to coincide with each other. As such, since light has very deteriorated coherence therebetween, WDM (wavelength division multiplexing) type optical communication simultaneously transmitting light having various wavelengths through one optical fiber has been preferred. The WDM type optical communication is one of very economical communication methods in that it may allow the optical fiber, which is a transmission medium of a signal, to be shared, thereby decreasing costs caused by an optical fiber routing.

Figure 1:
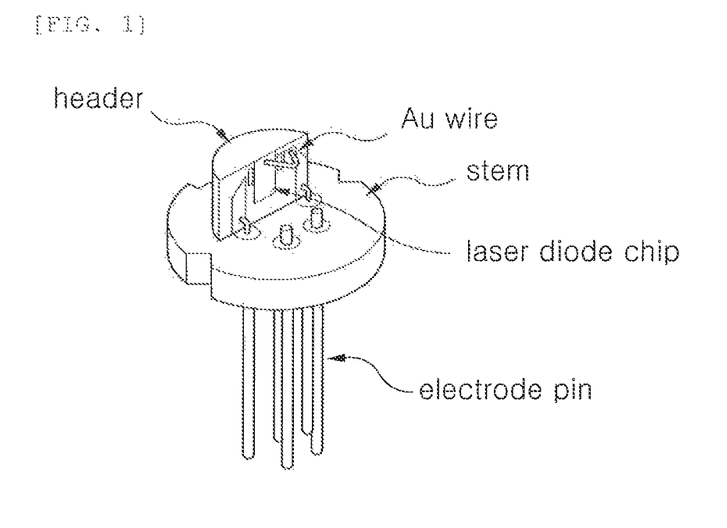
FIG. 1 illustrates an example of a TO can-type laser diode package according to the related art.

For the WDM type optical communication, there is proposed a package type where a high-speed laser diode chip is embedded in a TO can-type small package. FIG. 1 illustrates an example of a stem structure of a TO can-type package for ultrahigh-speed communication according to the related art. As illustrated in FIG. 1, the To can-type package according to the related art is manufactured by a package method in which a laser diode chip, and the like are attached to a stem manufactured by punching a through hole in a metal substrate and inserting a metal electrode pin sealed with glass into the through hole, and the electrode pin aria the laser diode chip are electrically connected to each other by a gold (Au) wire.

According to the related art, a method for directly connecting the laser diode chip and the electrode pin by the Au wire is mainly used. However, as the TO can-type package recently became high speed, a problem of transmission signal distortion by the Au wire occurs, so a method for minimizing distortion of a ultrahigh-speed radio frequency (RF) signal by a length of the Au wire by attaching an impedance-matched RF substrate between the laser diode chip and the electrode pin, attaching the laser diode chip onto the RF substrate, and then electrically connecting the RF substrate and the laser diode chip to each other by the Au wire, is used.

Meanwhile, FIG. 1 illustrates a stem structure applied to a ultrahigh-speed signal in 10 Gbps class which is conventionally commercially available. In FIG. 1, the RF substrate is manufactured by attaching an AlN substrate formed of a AlN material and manufactured in a RF stripe pattern to a header of the stem, wherein after the laser diode chip is attached to one side of the AlN substrate, the laser diode chip and a signal line on the RF substrate are electrically connected to each other by the Au wire.

In the structure illustrated in FIG. 1, an attachment position of the laser diode chip is regardless of a thickness of the AlN substrate, and the AlN substrate is manufactured by attaching an AlN RF substrate having a predefined thickness to a position of the header. In this structure, a thickness of the RF substrate may be arbitrarily defined.

Figure 2:
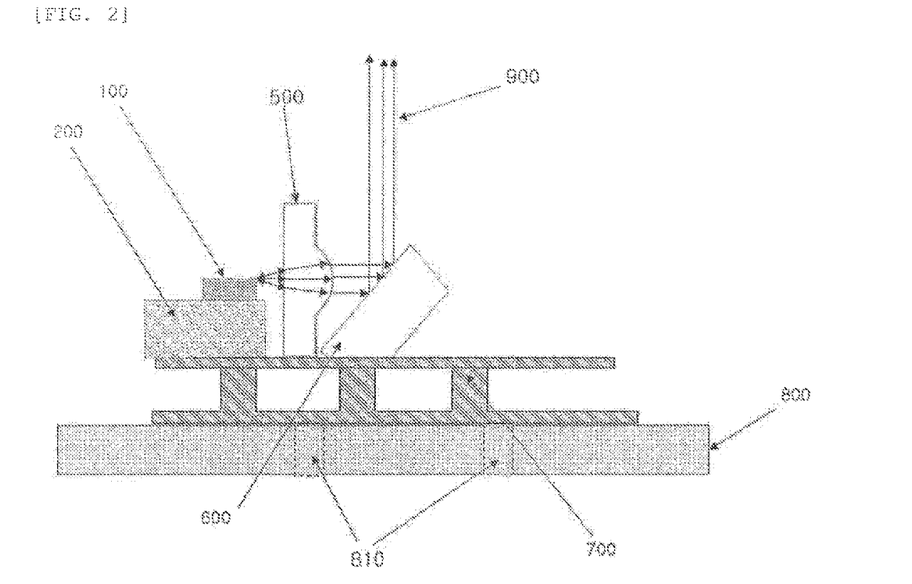
FIG. 2 illustrates an example of a side view of a TO can-type laser diode package in which a thermoelectric element is embedded according to the related art.

FIG. 2 illustrates an example of a side of a TO can-type laser diode package in which a thermoelectric element commonly used currently is embedded.

FIG. 2 illustrates an example in which a thermoelectric element 700 is disposed on a bottom of a stem 800, and a laser diode chip 100, a lens 500, and a 45° reflection mirror 600 are disposed on an upper plate of the thermoelectric element 700. A height to which laser light of the laser diode chip 100 is emitted should coincide with a central optical axis height of the lens 500, and typically, a size of the lens 500 is about 1 mm. Therefore, the central optical axis height of the lens 500 is about 0.5 mm. If the size of the lens 500 is further decreased, an aperture of the lens 500 is decreased. As a result, since it is difficult to collect enough laser light, it is difficult to decrease the size of the lens 500 to 0.8 mm or less even in the case in which the size of the lens 500 becomes smaller. Therefore, a height of a central axis of the lens 500 is 0.4 mm or more. Since the laser diode chip 100 typically has a thickness of about 0.1 mm, a height of a sub-mount 200 on which the laser diode chip 100 is put is typically about 0.4 mm in order to coincide a height of a laser emission point of the laser diode chip 100 with the central axis of the lens 500. However, it is difficult to manufacture a ultrahigh-speed signal transmission line capable of performing ultrahigh-speed communication using the sub-mount 200 having the thickness of 0.4 mm. Meanwhile, reference numeral 810 of FIG. 2 denotes a through hole into which the metal electrode pin is to be inserted, and reference numeral 900 denotes a propagation direction of laser light emitted by the laser diode chip 100.

Figure 3:
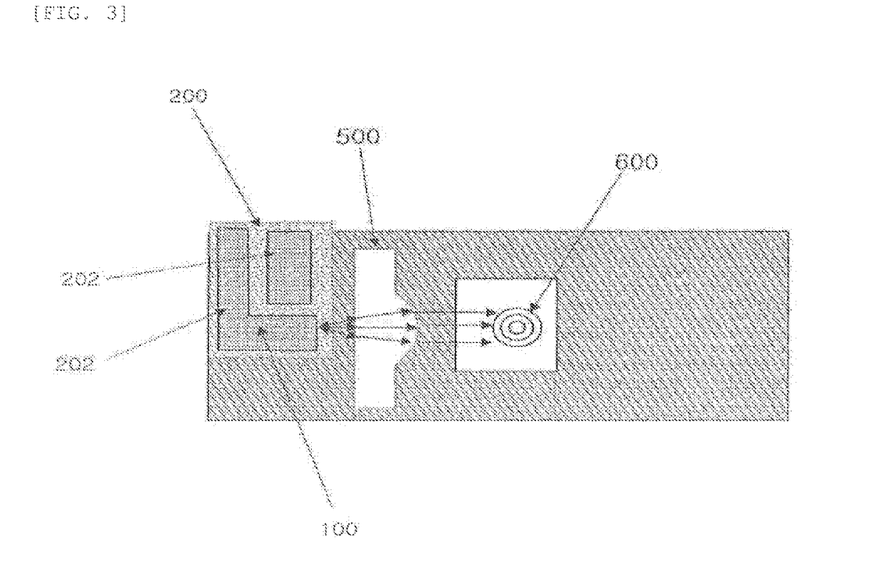
FIG. 3 illustrates an example of a plan view of a TO can-type laser diode package in which a lens is included according to the related art.

FIG. 3 illustrates an example of a plan view of a TO can-type package having a diameter of 6.0 mm which is recently used.

As illustrated in FIG. 3, in the case in which the laser diode chip 100 is assembled using the TO can-type package, in order to perform emission of laser light at a central portion of the TO can-type package, the 45° reflection mirror 600, the lens 500, and the laser diode chip 100 should be concentrated at one side of the TO can-type package. In the case of TO 60 standard having a diameter of 6.0 mm, an internal diameter allowed in any one direction from the center of the package is only about 1.9 mm. A half of the 45° reflection mirror 600, the lens 500, and the laser diode chip 100 should be disposed in the above-mentioned length, and in the case in which a length of the 45° reflection mirror 600 of at least about 0.5 mm is included and the thickness of the lens 500 is typically allocated to about 0.8 mm, a width allowed for the sub-mount 200 of the laser diode chip 100 is only 0.6 mm.

Meanwhile, in order to operate the laser diode chip 100 at high speed, a standard of all signal lines transmitting a signal to the laser diode chip 100 may be impedance-matched to single ended impedance of each of positive/negative transmission lines of 25 ohms, respectively, and may be impedance-matched to differential ended impedance of 50 ohms in the case in which two positive/negative transmission lines are incorporated. In FIG. 3, reference numeral 202 denotes a line for a differential ended signal transmission.

Figure 4:
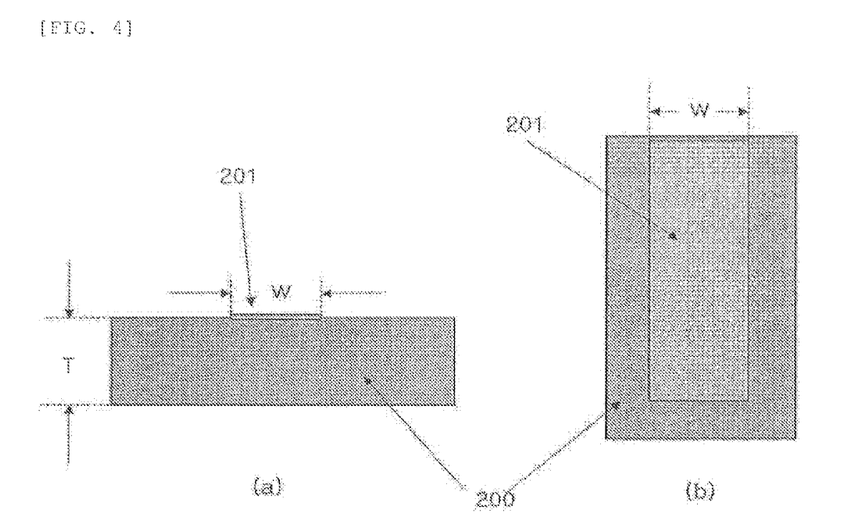
FIG. 4 illustrates an example of a substrate for single ended high-speed signal transmission according to the related art.
Figure 5:
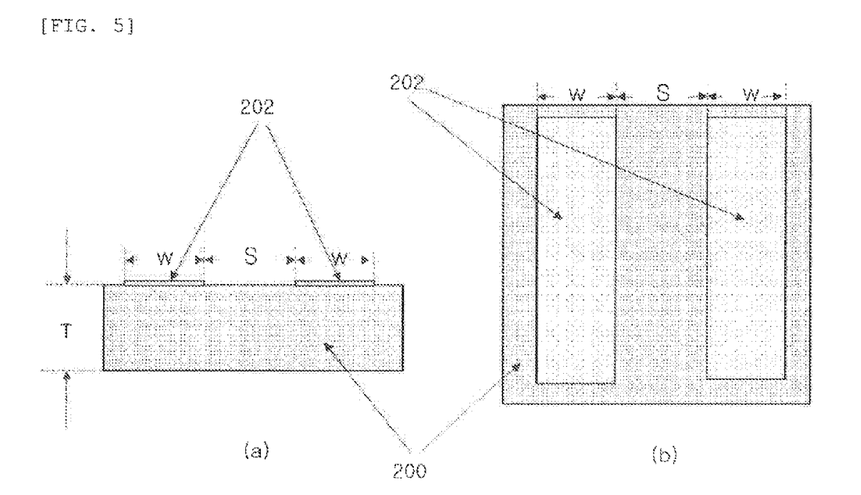
FIG. 5 illustrates an example of a substrate for differential ended high-speed signal transmission according to the related art.
Figure 6:
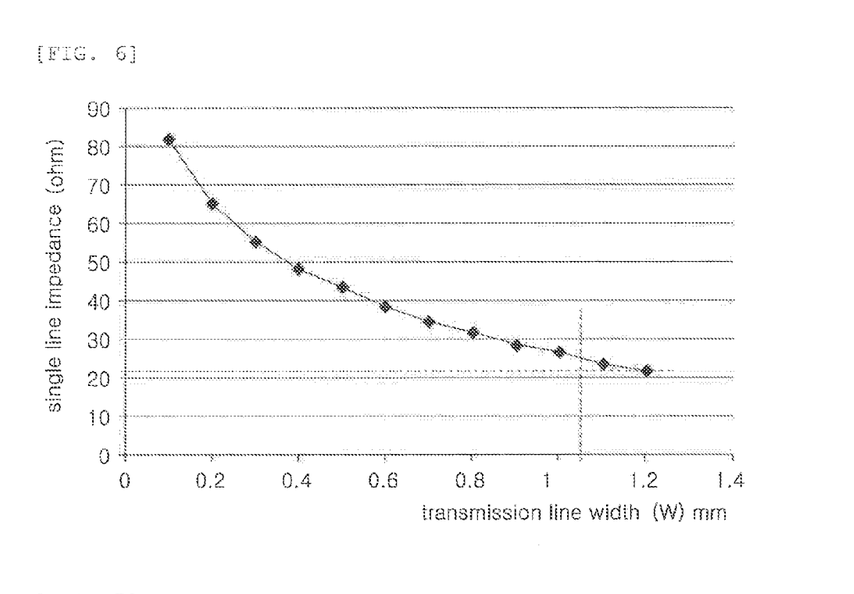
FIG. 6 illustrates an example of a change in single ended impedance according to a transmission signal line width of the case of a substrate having a thickness of 0.4 mm when a substrate for single ended high-speed signal transmission according to the related art is used.

FIG. 4 illustrates an example of a single transmission line, and FIG. 5 illustrates an example of a differential impedance transmission line. In a structure of FIG. 4, when a silicon substrate having a dielectric constant of 11.4 and a thickness of 0.4 mm is used, single ended impedance values calculated according to a width W of the transmission line 201 are shown in FIG. 6. In FIG. 6, in order to perform an impedance-matching of 25 ohms, the width W of the transmission line 201 should be about 1.05 mm. Since this width exceeds 0.6 mm, which is a size allowed as a width of a transmission substrate 200 for a laser diode chip in a very narrow TO can-type laser diode package; consequently it becomes the transmission line having a standard that cannot be adopted for a TO can-type subminiature package.

Figure 7:
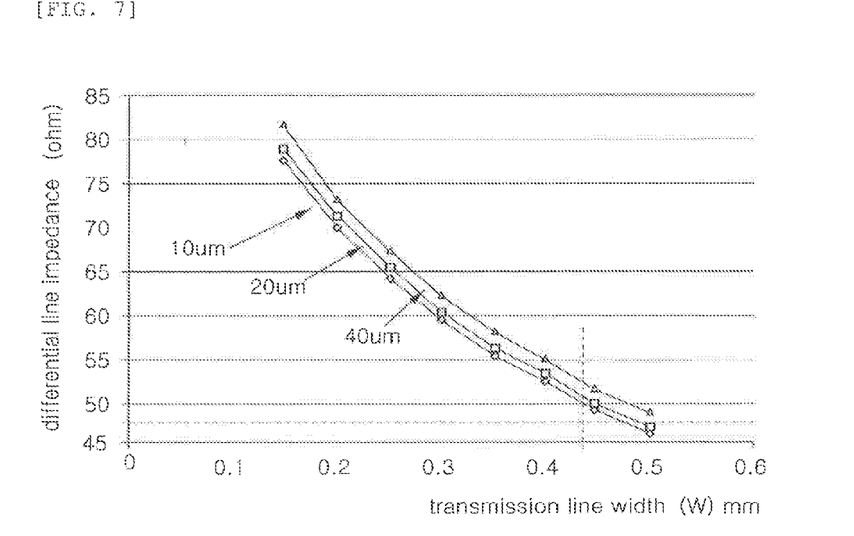
FIG. 7 illustrates an example of a change in differential ended impedance according to a transmission signal line width of the case of a substrate having a thickness of 0.4 mm when a substrate for differential ended high-speed signal transmission according to the related art is used.

In addition, in a structure of FIG. 5, when the silicon substrate having the dielectric constant of 11.4 and the thickness of 0.4 mm is used, impedance values of the differential ended transmission line 202 calculated according to the width W of the transmission line 202 and a distance S between the transmission lines are shown in FIG. 7. In FIG. 7, in order to perform an impedance-matching of 50 ohms, a width of one transmission line 202 should be at least about 0.45 mm, and consequently, in the case of the differential ended transmission line requiring two transmission lines, a width of a substrate of a ultrahigh-speed transmission line should be at least 0.9 mm or more. Since this width exceeds 0.6 mm, which is a size allowed for the transmission substrate 200 for a laser diode chip in the very narrow TO can-type laser diode package, it becomes the transmission line having a standard that may not be adopted for the TO can-type subminiature package.

DISCLOSURE

Technical Problem

The present invention has been made in an effort to solve the problems in the related art and an object of the present invention is to provide an optical module for ultrahigh-speed communication without limitation in selecting a size of a ultrahigh-speed transmission line substrate in manufacturing an optical element for ultrahigh-speed communication.

Technical Solution

In an optical module for ultrahigh-speed communication according to the present invention, when a high-speed signal transmission line substrate having a thickness of 0.4 mm is manufactured, two substrates are subsequently coupled to each other to allow a summed height of the two substrates to be 0.4 mm and a thickness of an upper substrate for high-speed signal transmission to which a laser diode chip is directly attached to be about 0.1 to 0.3 mm, so it is possible to provide a transmission line in which a impedance matching of single ended impedance of 25 ohms or differential ended impedance of 50 ohms is performed using a substrate for high-speed signal transmission having a width of 0.6 mm or less. Further, a height of an emission point of the laser diode chip attached to an upper portion of the substrate is increased to 0.5 mm, an optical coupling of the laser diode chip with a lens, or the like may be easily performed.

To this end, in the optical module for ultrahigh-speed communication according to the present invention, the substrate for high-speed signal transmission for transmitting a signal to a laser diode chip is formed by coupling an upper substrate for high-speed signal transmission on which line patterns for high-speed signal transmission are formed, and a lower substrate for high-speed signal transmission of which an upper surface has conductivity with each other.

Here, the laser diode chip may be attached to an upper one side of the substrate for high-speed signal transmission.

Further, the lower substrate for high-speed signal transmission may have the upper surface having conductivity by depositing a metal thin film on an upper surface of an insulator, and the metal thin film deposited on the upper surface of the lower substrate for high-speed signal transmission may be connected to a ground surface by a conductive epoxy or a wire bonding method so as to be grounded. Meanwhile, the lower substrate for high-speed signal transmission may be manufactured of a metal material.

The upper substrate for high-speed signal transmission may have the line patterns for high-speed signal transmission formed by depositing lines for signal transmission of a metal thin film to a substrate material of AlN or Si, and a thickness of the upper substrate for high-speed signal transmission may be in the range of 0.1 mm to 0.3 mm.

Advantageous Effects

The optical module for ultrahigh-speed communication according to the present invention may have single ended impedance of 25 ohms or differential ended impedance of 50 ohms to enable ultrahigh-speed communication, may have a height of about 0.4 mm of a substrate to which the laser diode chip for ultrahigh-speed communication is attached to easily enable an optical coupling between the laser diode chip, the lens, and the like, and may implement a high-speed transmission line using a width of 0.6 mm or less of the substrate to thereby provide a substrate for high-speed signal transmission which is effectively embedded in a TO can-type package having a narrow mounting area.

DESCRIPTION OF MAIN REFERENCE
NUMERALS OF DRAWINGS

100: Laser diode chip
200: Substrate for high-speed signal transmission
201: Line for single ended signal transmission
202: Line for differential ended signal transmission
210: Upper substrate for high-speed signal transmission
220: Lower substrate for high-speed signal transmission
230: Metal thin film
500: Lens
600: 45° reflection mirror
700: Thermoelectric element
800: TO can-type package stem
810: Stem through hole

BEST MODE

Hereinafter, exemplary embodiments of the present invention will be described in detail with reference to the accompanying drawings.

Figure 8:
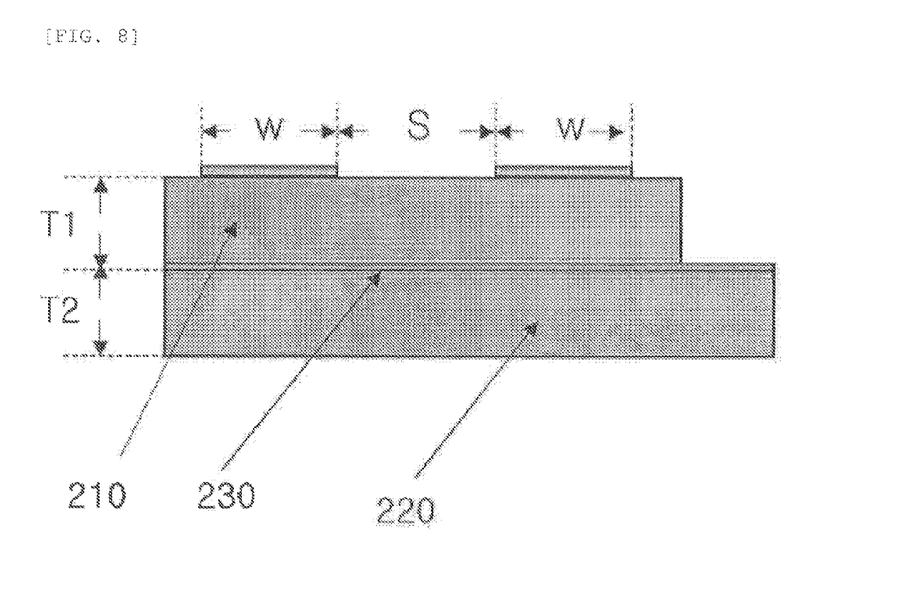
FIG. 8 illustrates a side view of a substrate for high-speed signal transmission manufactured by fixing an upper substrate and a lower substrate to each other according to the present invention.
Figure 9:
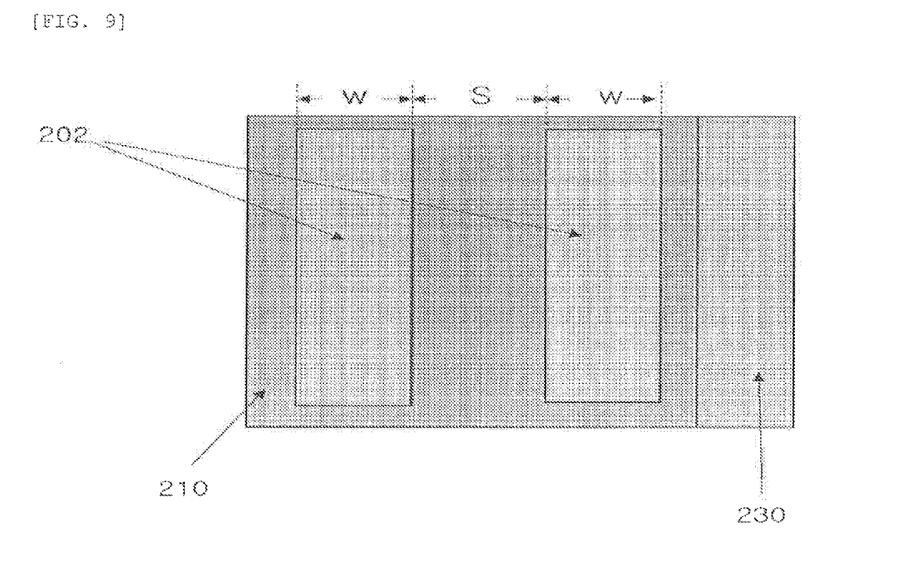
FIG. 9 illustrates a plan view of the substrate for high-speed signal transmission manufactured by fixing the upper substrate and the lower substrate to each other according to the present invention.

FIG. 8 illustrates a side view of a substrate for high-speed signal transmission manufactured by fixing an upper substrate and a lower substrate to each other according to an exemplary embodiment of the present invention and FIG. 9 illustrates a plan view of the substrate for high-speed signal transmission.

When a high-speed transmission line is intended to be manufactured using a single substrate having a predetermined height, for example, a single substrate having a height of 0.4 mm, as described above in FIGS. 6 and 7, in order to match single ended impedance to 25 ohms, a signal transmission line width W of 1.05 mm or more is required, and in order to match differential ended impedance to 50 ohms, a substrate having a width of 0.6 mm or more obtained by adding widths of two transmission lines is required.

As illustrated in FIGS. 8 and 9, according to an exemplary embodiment of the present invention, the substrate for high-speed signal transmission is formed to include an upper substrate 210 for high-speed signal transmission and a lower substrate 220 for high-speed signal transmission, which are a two-layer structure, a metal thin film 230 coated with a metal is formed on the lower substrate for high-speed signal transmission 220, and lines 202 for signal transmission are formed on the upper substrate for high-speed signal transmission 210. When the metal thin film 230 formed on the lower substrate 220 for high-speed signal transmission is used as a ground surface, a thickness of the substrate included to perform the high-speed signal transmission includes only a thickness of the upper substrate 210 for high-speed signal transmission.

Figure 10:
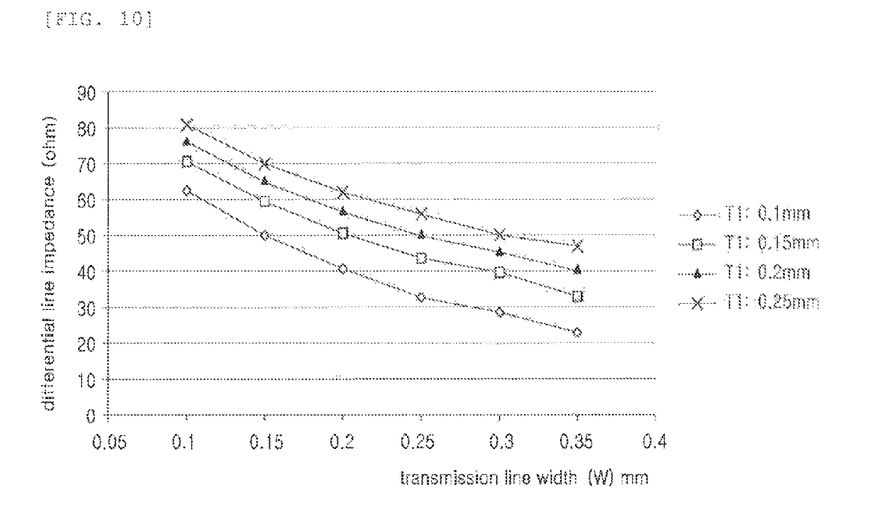
FIG. 10 illustrates a change in differential ended impedance according to a thickness of an upper substrate for high-speed signal transmission and a width of a signal line for high-speed signal transmission in FIGS. 8 and 9.

FIG. 10 illustrates a change in differential ended impedance (ohm) according to a thickness T1 of the upper substrate for high-speed signal transmission and a width W of a signal line for high-speed signal transmission in FIGS. 8 and 9.

In FIG. 10, it was calculated that a distance S between two lines 202 for signal transmission is 0.03 mm. Here, when the thickness T1 of the upper substrate 210 for high-speed signal transmission is 0.1 mm, 0.15 mm, 0.2 mm, and 0.25 mm, respectively, the width W of one line 202 for signal transmission for obtaining differential ended impedance of 50 ohms is 0.15 mm, 0.2 mm, 0.25 mm, and 0.3 mm. Therefore, a minimum width of the line 202 for differential ended signal transmission where two single transmission lines should be disposed to be spaced apart from each other by a predetermined interval S is 0.33 mm, 0.43 mm, 0.53 mm, and 0.63 mm, so it is possible to use the substrate for high-speed signal transmission which may be applied to a TO can-type package having a very narrow mounting area.

Here, the lower substrate 220 for high-speed signal transmission may be formed of a material of AlN or Si, but is not necessarily the substrate formed of AlN or Si. For example, a substrate having any characteristics that a surface thereof has electrical conductivity is also available. As an example of the lower substrate 220 for high-speed signal transmission, a dielectric material or a semiconductor substrate having a surface coated with a metal thin film such as a metal or $Al_2O_3$ having a surface coated with the metal is also available. If the lower substrate 220 for high-speed signal transmission is formed by coating the metal thin film 230 on a surface of a substrate having insulation property, a method for electrically connecting the metal thin film 230 of the lower substrate 220 for high-speed signal transmission to the ground surface needs to be used to ground an upper metal thin film 230 of the lower substrate 220 for high-speed signal transmission. Here, the metal thin film 230 of the lower substrate 220 for high-speed signal transmission and the ground surface may be electrically connected to each other by using a conductive epoxy, and the metal thin film 230 of the lower substrate 220 for high-speed signal transmission may also be grounded by a wire bonding method.

The height proposed in the exemplary embodiments of the present invention described above is merely an illustration for easily describing the description and the effect of the present invention, and it is apparent that the present invention may also be applied to various exemplary embodiments in which the height and the width of the substrate are separated to implement desired impedance using a given width of the substrate and to determine the entirety of height of the substrate for signal transmission using the height of the lower substrate for high-speed signal transmission, in order to implement transmission signal impedance which is difficult to implement according to the height and the width of the substrate for signal transmission.

The present invention is not limited to the embodiments described above and it should be understood that the present invention may be changed and modified in various ways by those skilled in the art within a range equivalent to the spirit of the present invention and claims to be described below.

The invention claimed is:

1. An optical module for ultrahigh-speed communication, wherein a substrate for high-speed signal transmission for transmitting a signal to a laser diode chip is formed an upper substrate (210) for high speed signal transmission on which two positive/negative transmission line patterns (202) for high-speed signal transmission are disposed and spaced apart from one another by a predetermined interval (S) and lie within a common plane, and the upper substrate (210) for high-speed signal transmission is coupled to a lower substrate (220) for high-speed signal transmission of which an upper surface has conductivity with one another, an upper surface of the lower substrate (220) for high-speed signal transmission has conductivity by dsepositing a metal thin film (230) on an upper surface of an insulator supported by the lower substrate (220), and the metal thin film (230), deposited on the upper surface of the lower substrate (220) for high-speed signal transmission, is connected to a ground surface so as to be grounded, wherein locating the metal thin film (230) between the upper and lower substrates (210, 220) decreases a spacing distance between the two positive/negative transmission line patterns (202) and the metal thin film (230) so that widths (W) of the two positive/negative transmission line patterns (202), for obtaining the same differential ended impedance, are correspondingly reduced thereby reducing a size of the optical module.

2. The optical module of claim 1, wherein the laser diode chip (100) is attached to an upper one side of the substrate for high-speed signal transmission.

3. The optical module of claim 1, wherein the lower substrate (220) for high-speed signal transmission is manufactured of a metallic material.

4. The optical module of claim 1, wherein the metal thin film (230), deposited on the upper surface of the lower substrate (220) for high-speed signal transmission, is connected to the ground surface by a conductive epoxy or a wire bonding technique so as to be grounded.

5. The optical module of claim 1, wherein the two positive/negative transmission line patterns (202), for high-speed signal transmission, are formed by depositing lines (201) and (202) for signal transmission of a thin metallic film to a substrate material of AlN or Silicon; and a thickness of the upper substrate (210), for a high-speed signal transmission, is in a range of 0.1 mm to 0.3 mm.

* * * * *